(12) United States Patent
Hirotsu et al.

(10) Patent No.: US 8,653,601 B2
(45) Date of Patent: Feb. 18, 2014

(54) CURRENT CONTROL SEMICONDUCTOR ELEMENT AND CONTROL DEVICE USING THE SAME

(75) Inventors: Teppei Hirotsu, Hitachi (JP); Nobuyasu Kanekawa, Hitachi (JP); Itaru Tanabe, Naka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 13/807,278

(22) PCT Filed: Jun. 2, 2011

(86) PCT No.: PCT/JP2011/062734
§ 371 (c)(1),
(2), (4) Date: Dec. 27, 2012

(87) PCT Pub. No.: WO2012/002100
PCT Pub. Date: Jan. 5, 2012

(65) Prior Publication Data
US 2013/0105913 A1    May 2, 2013

(30) Foreign Application Priority Data

Jun. 28, 2010 (JP) ................................. 2010-146421

(51) Int. Cl.
*H01L 21/8234* (2006.01)
*H01L 29/76* (2006.01)
*H02M 3/24* (2006.01)

(52) U.S. Cl.
USPC ........... 257/368; 257/341; 257/391; 257/392; 257/401; 257/404; 257/E21.411; 257/E21.616; 257/E21.618; 327/103; 363/98; 438/34; 438/689

(58) Field of Classification Search
USPC ................. 257/341, 368, 391, 392, 401, 404, 257/E21.411, E21.616, E21.618; 323/282; 327/103; 363/98; 438/34, 689
See application file for complete search history.

(56) References Cited

U.S. PATENT DOCUMENTS 5,767,545 A * 6/1998 Takahashi ..................... 257/341
(Continued)

FOREIGN PATENT DOCUMENTS

JP     6-120495 A     4/1994
JP     8-55960 A      2/1996
(Continued)

OTHER PUBLICATIONS

International Search Report dated Aug. 30, 2011 including English-language translation (Four (4) pages).

*Primary Examiner* — Dao H Nguyen
(74) *Attorney, Agent, or Firm* — Crowell & Moring LLP

(57) ABSTRACT

This invention provides a current control semiconductor element in which dependence of a sense ratio on a temperature distribution is eliminated and the accuracy of current detection using a sense MOSFET can be improved, and to provide a control device using the current control semiconductor element. The current control semiconductor element 1 includes a main MOSFET 7 that drives a current and a sense MOSFET 8 that is connected to the main MOSFET in parallel and detects a current shunted from a current of the main MOSFET. The main MOSFET is formed using a multi-finger MOSFET that has a plurality of channels and is arranged in a row. When a distance between the center of the multi-finger MOSFET 7 and a channel located farthest from the center of the multi-finger MOSFET 7 is indicated by L, a channel that is located closest to a position distant by a distance of $(L/(\sqrt{3}))$ from the center of the multi-finger MOSFET is used as a channel for the sense MOSFET 8.

6 Claims, 7 Drawing Sheets

(56) References Cited

U.S. PATENT DOCUMENTS

| | | | |
|---|---|---|---|
| 5,841,649 A * | 11/1998 | Willett et al. | 363/98 |
| 6,232,642 B1 * | 5/2001 | Yamazaki | 257/404 |
| 2005/0233506 A1 * | 10/2005 | Horch et al. | 438/134 |
| 2011/0018593 A1 * | 1/2011 | Williams | 327/109 |
| 2011/0111541 A1 * | 5/2011 | Takemura | 438/34 |
| 2013/0181294 A1 * | 7/2013 | Bouton et al. | 257/368 |

FOREIGN PATENT DOCUMENTS

| | | |
|---|---|---|
| JP | 8-64816 A | 3/1996 |
| JP | 9-293856 A | 11/1997 |
| JP | 10-256541 A | 9/1998 |
| JP | 2005-50913 A | 2/2005 |
| JP | 2006-203415 A | 8/2006 |
| JP | 2008-244094 A | 10/2008 |

* cited by examiner

CURRENT CONTROL SEMICONDUCTOR ELEMENT AND CONTROL DEVICE USING THE SAME

TECHNICAL FIELD

The present invention relates to a current control semiconductor element and a control device using the current control semiconductor element. The invention more particularly relates to a current control semiconductor element and a control device using the current control semiconductor element which are suitable to detect a current flowing in the current control semiconductor element with high accuracy.

BACKGROUND ART

Electric actuators such as a motor and a solenoid have been widely used for conversion of electric signals to mechanical motions or hydraulic pressure as various control targets are electronically controlled. It is essential to control a current with high accuracy to sophisticate the electric actuators.

For such high-accuracy current control, accurate detection of a current value is required. In general, the following method is used for this purpose: a total current is made to flow through a highly accurate shunt resistor to measure the voltage across the shunt resistor. In this method, however, the highly accurate and large-capacity shunt resistor is used, resulting in an increase in the cost and size of a control device. Further, since the total current to be detected flows through the shunt resistor, the amount of heat generated therefrom is large and thereby the cost for heat radiation will increase.

To solve the aforementioned problem, the following technique is known: a technique for detecting a current at low loss by connecting a main MOSFET for driving a, current to a current detector that uses a sense MOSFET in parallel (refer to, for example, Patent Document 1). A gate for the sense MOSFET is the same as that for the main MOSFET. The gate width of the sense MOSFET is designed approximately in a range of 1/1000 to 1/100. The amount of a current flowing in the sense MOSFET is approximately 1/1000 to 1/100 the amount of a current flowing in the main MOSFET. This makes it possible to lessen loss of a current that will occur in the current detector, compared with the method using the shunt resistor.

PRIOR ART DOCUMENT

Patent Document

Patent Document 1: JP-2006-203415-A

SUMMARY OF THE INVENTION

Problem to be Solved by the Invention

In the current detection by the sense MOSFET, however, current detection accuracy depends on a current ratio (sense ratio that is a ratio of a current value of the sense MOSFET to a current value of the main MOSFET) of the sense MOSFET to the main MOSFET.

Since the main MOSFET generates heat when it drives a current, a temperature distribution develops in the main MOSFET and a difference occurs between respective characteristics of the main MOSFET and the sense MOSFET. As a result, the sense ratio varies and the problem arises that the current detection accuracy is reduced.

Objects of the invention are to provide a current control semiconductor element in which dependence of a sense ratio on a temperature distribution is eliminated and the accuracy of current detection using a sense MOSFET can be improved, and to provide a control device using the current control semiconductor element.

Means for Solving the Problem (1) In order to accomplish the aforementioned object, according to the invention, a current control semiconductor element includes a main MOSFET that drives a current, and a sense MOSFET that is connected to the main MOSFET in parallel and detects a current shunted from a current of the main MOSFET. The main MOSFET and the sense MOSFET are arranged on the same semiconductor chip. The main MOSFET is formed using a multi-finger MOSFET that has a plurality of channels and is arranged in a row. A part of the channels of the multi-finger MOSFET is used as a channel for the sense MOSFET. When a distance between the center of the multi-finger MOSFET and a channel located farthest from the center of the multi-finger MOSFET is indicated by L, a channel that is located closest to a position distant by a distance of $(L/(\sqrt{3}))$ from the center of the multi-finger MOSFET is used as the channel for the sense MOSFET.

With the aforementioned configuration, dependence of a sense ratio on a temperature distribution is eliminated and the accuracy of current detection using a sense MOSFET can be improved.

(2) In Item (1), it is preferable that the MOSFETs that form the multi-finger MOSFET have the same pattern.

(3) In Item (2), it is preferable that channels be arranged symmetrically with respect to the center of the multi-finger MOSFET in a direction in which the MOSFETs of the multi-finger MOSFET are arranged, and be closest to positions distant by the distance of $(L/(\sqrt{3}))$ from the center of the multi-finger MOSFET, the channels being used as channels for sense MOSFETs.

(4) In Item (1), it is preferable that multi-finger MOSFETs having the same shape as the multi-finger MOSFET arranged in the row be arranged in a plurality of rows in a direction of the widths of the channels of the multi-finger MOSFET so that a multi-finger array is formed, and when a distance between the center of the multi-finger array and a multi-finger MOSFET located farthest from the center of the multi-finger array in the direction in which the multi-finger MOSFETs are arranged is indicated by Lx, and distances between the centers of the multi-finger MOSFETs and channels located farthest from the centers of the multi-finger MOSFETs in the direction of the widths of the channels of the multi-finger MOSFETs are indicated by Ly, channels that are included in selected multi-finger MOSFETs located closest to positions distant by a distance of $(Lx/(\sqrt{3}))$ from the center of the multi-finger array and are located closest to positions distant by a distance of $(Ly/(\sqrt{3}))$ from the centers of the selected multi-finger MOSFETs be used as channels for sense MOSFETs.

(5) In Item (4), it is preferable that when distances between the centers of the selected multi-finger MOSFETs and channels located farthest from the centers of the selected multi-finger MOSFETs in the direction of the widths of the channels of the multi-finger MOSFETs are indicated by Ly, channels that are located closest to the positions distant by the distance of $(Ly/(\sqrt{3}))$ from the centers of the selected multi-finger MOSFETs be used as the channels for the sense MOSFETs, and other MOSFETs selected as the multi-finger MOSFETs located closest to the positions distant by the distance of $(Lx/(\sqrt{3}))$ from the center of the multi-finger array be used as dummies.

(6) In order to accomplish the aforementioned object, according to the invention, a control device includes a current control semiconductor element and a microcontroller that controls the current control semiconductor element. The current control semiconductor element includes a main MOSFET that drives a current, and a sense MOSFET that is connected to the main MOSFET in parallel and detects a current shunted from a current of the main MOSFET. The main MOSFET and the sense MOSFET are arranged on the same semiconductor chip. The main MOSFET is formed using a multi-finger MOSFET that has a plurality of channels and is arranged in a row. A part of the channels of the multi-finger is used as a channel for the sense MOSFET. When a distance between the center of the multi-finger MOSFET and a channel located farthest from the center of the multi-finger MOSFET is indicated by L, a channel that is located closest to a position distant by a distance of $(L/(\sqrt{3}))$ from the center of the multi-finger MOSFET is used as the channel for the sense MOSFET.

With the aforementioned configuration, dependence of a sense ratio on a temperature distribution is eliminated and the accuracy of current detection using a sense MOSFET can be improved.

Effects of the Invention

According to the invention, dependence of a sense ratio on a temperature distribution is eliminated and the accuracy of current detection using a sense MOSFET can be improved.

MODE FOR CARRYING OUT THE INVENTION

A configuration and operations of a current control semiconductor element according to a first embodiment of the invention are described below with reference to FIGS. 1 and 2.

First, the overall configuration of the current control semiconductor element according to the present embodiment is described with reference to FIG. 1.

Figure 1:
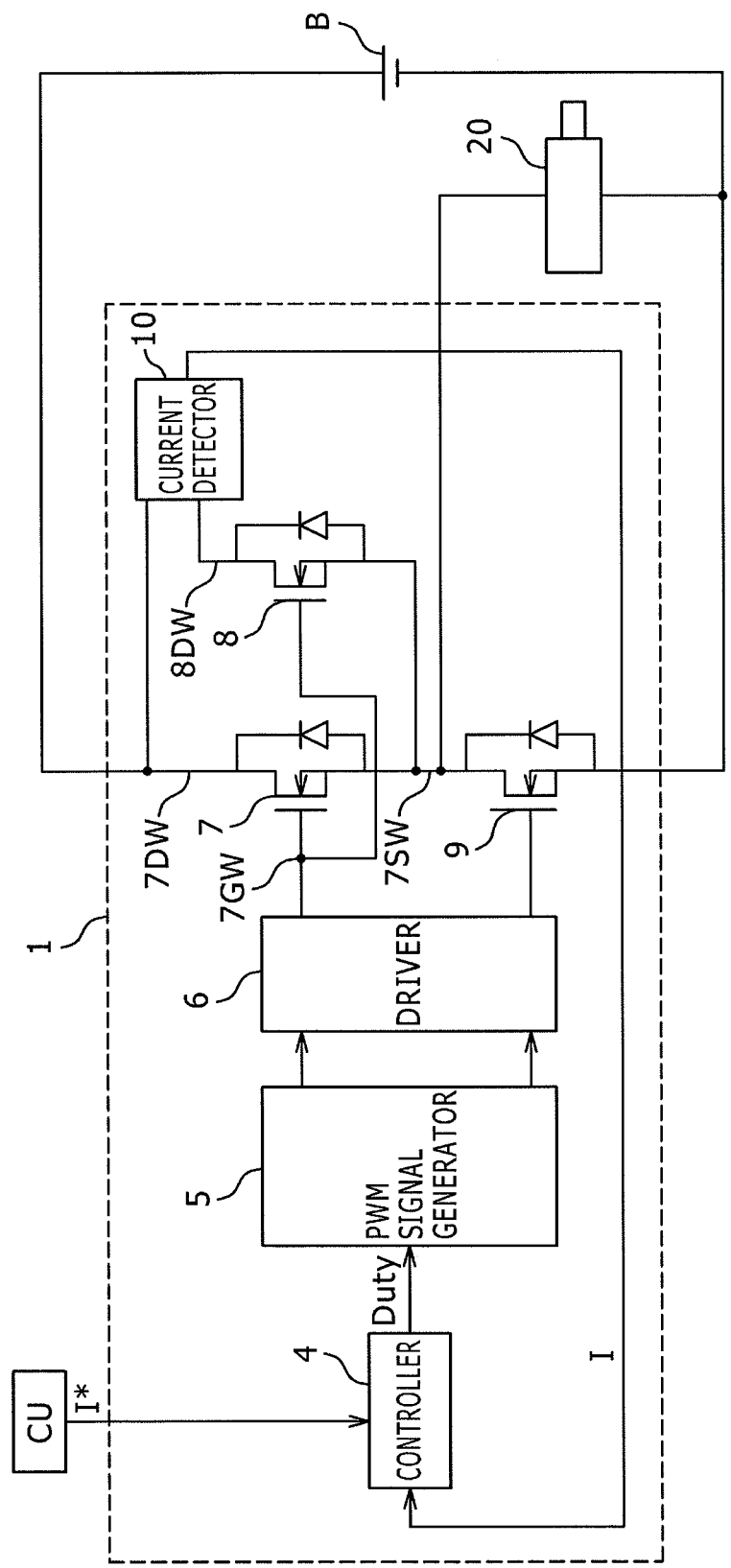
FIG. 1 is a block diagram illustrating an overall configuration of a current control semiconductor element according to a first embodiment of the invention.

FIG. 1 is a block diagram illustrating the overall configuration of the current control semiconductor element according to the first embodiment of the invention.

The current control semiconductor element 1 includes a controller 4, a PWM signal generator 5, a driver 6, a main MOSFET 7, a sense MOSFET 8, a low-side MOSFET 9 and a current detector 10.

The current control semiconductor element 1 is connected to a solenoid 20 and a battery B which supplies a voltage to the solenoid 20. The current control semiconductor element 1 turns on/off the voltage to be supplied to the solenoid 20 by PWM (Pulse Width Modulation). The current control semiconductor element 1 drives a current that flows in the solenoid 20.

The main MOSFET 7 is a switch arranged between the solenoid 2 and the battery B. The main MOSFET 7 is in an ON state when a gate signal 7GW for the main MOSFET 7 is at a high level, and is in an OFF state when the gate signal 7GW is at a low level. When the main MOSFET 7 is in the ON state and the low-side MOSFET 9 is in an OFF state, a current flows from the battery 3 to the solenoid 2 through a line 7DW drawn out from a drain of the main MOSFET 7, the main MOSFET 7 and a line 7SW drawn out from a source of the main MOSFET.

When the main MOSFET 7 is in the OFF state, the low-side MOSFET 9 is used as a path for returning a current that flows to the solenoid 2. During a period when the main MOSFET 7 is in the OFF state, the low-side MOSFET 9 is in an ON state.

When the main MOSFET 7 is turned on, the sense MOSFET 8 is simultaneously turned on, and a current shunted from a current of the main MOSFET 7 flows through a line 8DW drawn out from a drain of the sense MOSFET.

The current detector 10 detects a current that has flowed through the line 8DW drawn out from the drain of the sense MOSFET, and outputs a result of the detection to the controller 4.

The controller 4 calculates and outputs a duty value that is optimal to cause a current of the solenoid 2 to follow a target value I* output from an upstream-side control unit (CU).

In accordance with the duty value received from the controller 4, The PWM signal generator 5 generates a pulse for turning on the high-side MOSFET 7 and a pulse for turning on the sense MOSFET 8.

The driver 6 increases voltages of the pulses received from the PWM signal generator 5 to voltages for driving the high-side MOSFET 7 and the sense MOSFET 8.

Next, a layout of main and sense MOSFETs 7 and 8 that are used in the current control semiconductor element according to the present embodiment is described with reference to FIG. 2.

Figure 2:
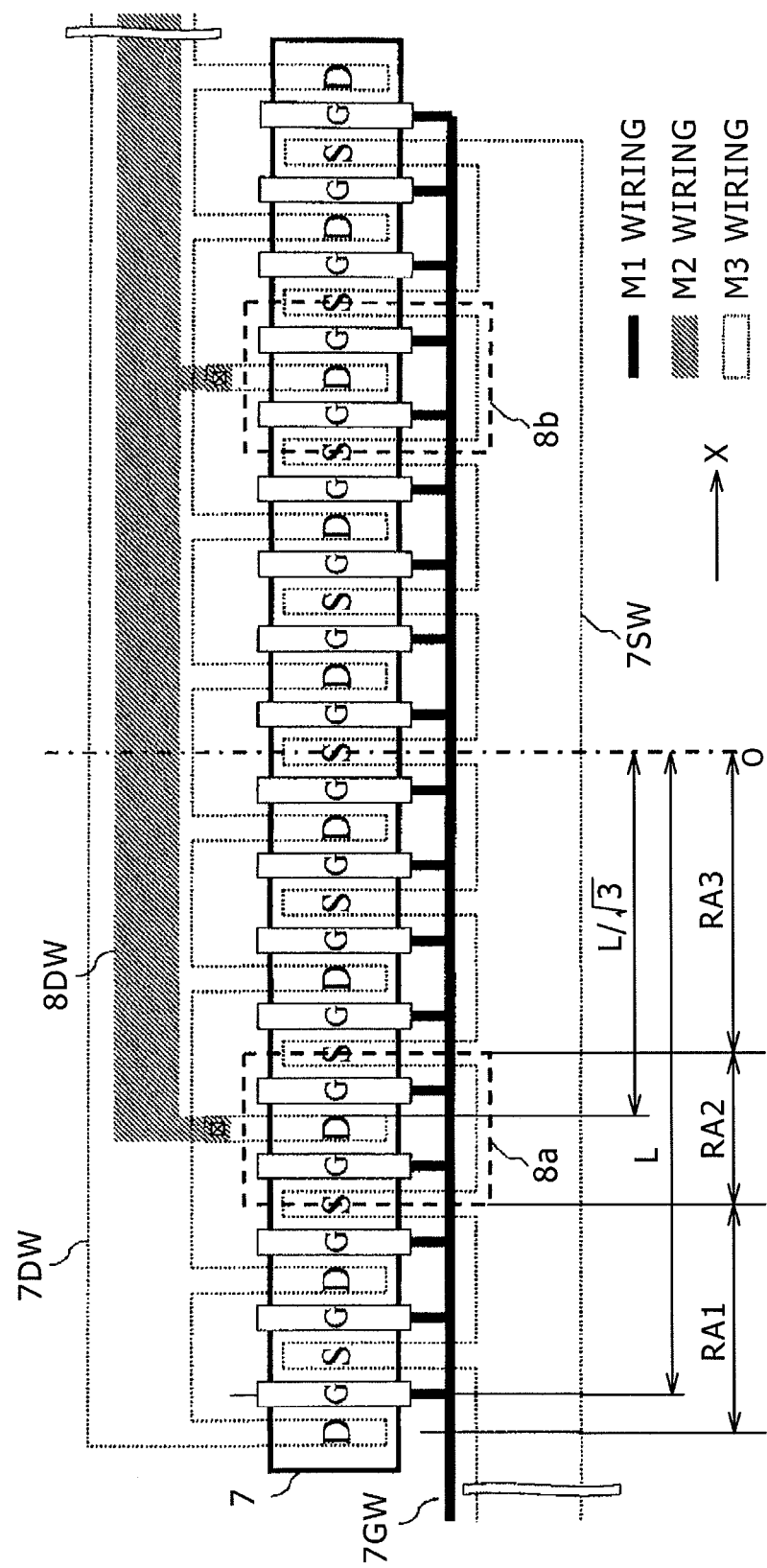
FIG. 2 is a layout diagram illustrating main and sense MOSFETs that are used in the current control semiconductor element according to the first embodiment of the invention.

FIG. 2 is a layout diagram illustrating the main and sense MOSFETs that are used in the current control semiconductor element according to the first embodiment of the invention. In FIG. 2, reference symbols and a reference numeral that are the same as those illustrated in FIG. 1 indicate the same parts.

The main MOSFETs 7 and the sense MOSFETs 8 (8a, 8b) are formed in a multi-finger MOSFET on the same semiconductor chip. The multi-finger MOSFET has a plurality of channels having the same shape (current paths located under gates arranged between drains and sources). The main MOSFETs 7 and the sense MOSFETs 8 are arranged in a single row in a direction (X direction) perpendicular to a channel width direction. Two regions 8a and 8b that are surrounded by dotted lines are regions in which the sense MOSFETs 8 are formed in main MOSFETs 7.

A sense ratio when temperature distributions exist in the main MOSFETs 7 and the sense MOSFETs 8 is described.

The main MOSFETs 7 have a pattern symmetric about an alternate long and short dashed line O illustrated in FIG. 2. The position of the alternate long and short dashed line is treated as the origin O. A distance between the origin O and a channel that is located on the left side of FIG. 2 and farthest from the origin O is indicated by L.

A temperature distribution T(x) when heat is uniformly generated in a one-dimensional region x defined by an inequality of (O<x<L) is expressed as follows.

$$T(x) = -ax^2 + b \quad (1)$$

The temperature distribution T(x) is expressed by the quadratic function.

When channel currents I of the multi-finger MOSFET are approximated using a primary expression of a temperature T, a distribution I(x) of the channel currents is expressed as follows.

$$I(x) = -\alpha x^2 + \beta \quad (2)$$

An average value Iave of currents Ix of channels within the region x defined by the inequality of (O<x<L) is expressed as follows.

$$Iave = (1/L)\int I(x)dx = -(\alpha/3)L^2 + \beta \quad (3)$$

A position at which a channel current matches the average value Iave is calculated using Equation (4).

$$-\alpha x^2 + \beta = -(\alpha/3)L + \beta \quad (4)$$

When Equation (4) is solved, $x = L/(\sqrt{3})$.

Thus, when a distance between the center O of the multi-finger MOSFET and a channel that is farthest from the center O of the multi-finger MOSFET is indicated by L, current values of channels that are closest to positions distant by a distance of $(L/(\sqrt{3}))$ from the center O of the multi-finger MOSFET are closest to the average of current values of the channels within the multi-finger MOSFET. Therefore, when the channels are used as sense MOSFETs and a temperature distribution exists, the precision of the sense ratio can be improved.

In the example of the layout illustrated in FIG. 2, it is sufficient if the third outermost drains D that contact the channels located closest to the positions distant by the distance of $(L/(\sqrt{3}))$ from the center O of the multi-finger MOSFET are used for sense MOSFETs and connected to the drawn-out line 8DW for the sense MOSFETs.

The center O of the multi-finger MOSFET is equidistant from the drains that are under the same condition and located on the left and right sides. Specifically, the two drains exist. Thus, by using the two drains for the sense MOSFET, the main MOSFETs and the sense MOSFETs form a common centroid layout, and spatial dependence of channel currents can be equalized.

On the leftmost side of FIG. 2, a drain D, a gate G and a source S form a first MOSFET in the layout illustrated in FIG. 2. Regarding the right side of the first MOSFET, the source S is used for the first MOSFET and a second MOSFET that includes the source S, another gate G and another drain D.

Three main MOSFETs are arranged in a range RA1 on the left side of the origin O. Two sense MOSFETs are arranged in the next range RA2. As described above, the drain D that is the third outermost channel is used for the sense MOSFET and used to detect a current. Since the drain D that is the third outermost channel is commonly used for MOSFETs that are both sides of the drain D, it is necessary to arrange two sense MOSFETs. In addition, four main MOSFETs are arranged in the next range RA3. Specifically, the seven main MOSFETs and the two sense MOSFETs are arranged. Further, in the layout illustrated in FIG. 2, since the MOSFETs are arranged symmetrically about the alternate long and short dashed line, fourteen main MOSFETs and four sense MOSFETs are arranged in the direction (X direction) perpendicular to the channel width direction.

The drains D of the main MOSFETs are connected to each other through the line 7DW drawn out from the drains of the main MOSFETs. On the other hand, the drains D of the sense MOSFETs are connected to each other through the line 8DW drawn out from the drains of the sense MOSFETs.

In addition, the sources S of the main MOSFETs and the sources S of the sense MOSFETs are connected to each other through the line 7SW drawn out from the sources of the main MOSFETs. The gates G of the main MOSFETs and the gates G of the sense MOSFETs are connected to each other through the 7GW drawn out from the gates of the main MOSFETs.

Since large currents flow in the line 7DW drawn out from the drains of the main MOSFETs and the line 7SW drawn out from the sources of the main MOSFETs, wide M3 wirings are used as the lines 7DW and 7SW. In addition, since a small current flows as a gate signal in the 7GW drawn out from the gates of the main MOSFETs, a narrow M1 wiring is used as the line 7GW. The amount of a current flowing in the line 8DW drawn out from the drains of the sense MOSFETs is smaller than the amount of the current flowing in the line 7DW drawn out from the drains of the main MOSFETs and the amount of the current flowing in the line 7SW drawn out from the sources of the main MOSFETs. Thus, an M2 wiring that has a smaller width than the M3 wirings is used as the line 8DW.

In the layout illustrated in FIG. 2, the main MOSFETs 7 and the sense MOSFETs 8 (8a, 8b) are formed in the same shape. Specifically, the widths of the gates of the main MOSFETs are equal to the widths of the gates of the sense MOSFETs. Thus, the sense ratio is 2/7. FIG. 2 schematically illustrates the layout for convenience of the description. In the actual layout, 400 main MOSFETs and 4 sense MOSFETs are arranged in the X direction, for example. In this case, the sense ratio is 1/100.

In the example illustrated in FIG. 1, the sense MOSFET 8 and the main MOSFET 7 are arranged in parallel. In contrast, the sense MOSFET may be arranged in parallel with the low-side MOSFET 9 and detect a current flowing in the low-side MOSFET. In this case, in the layout illustrated in FIG. 2, it is sufficient if the third outermost source S that contacts the channel located closest to the position distant by the distance of $(L/(\sqrt{3}))$ from the center of the multi-finger MOSFET is used for the sense MOSFET.

As described above, the precision of the sense ratio can be improved by the layout according to the present embodiment even when a temperature distribution exists in the main MOSFETs.

Next, a configuration and operations of a current control semiconductor element according to a second embodiment of the invention are described with reference to FIG. 2. The overall configuration of the current control semiconductor element according to the present embodiment is the same as the configuration illustrated in FIG. 1.

Figure 3:
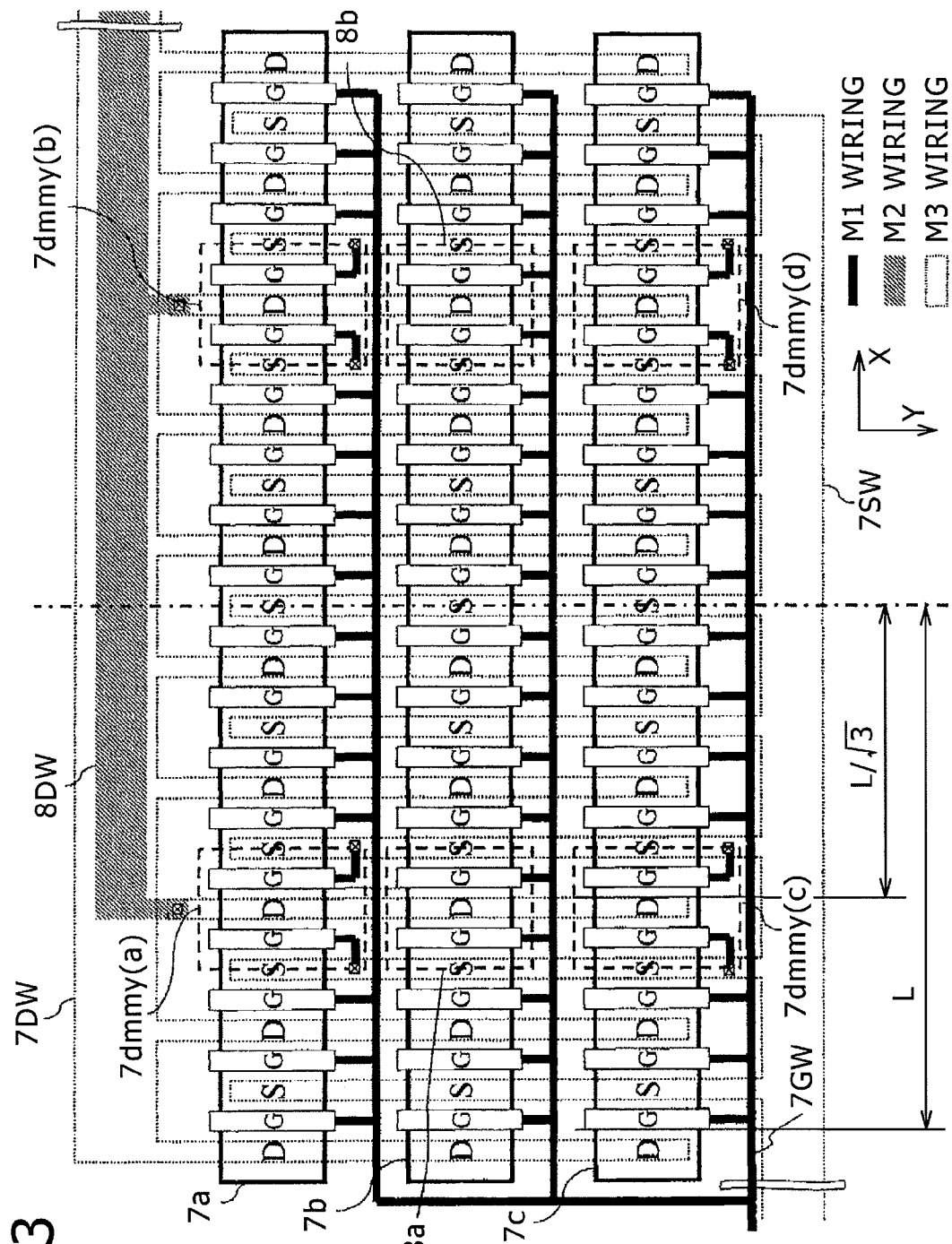
FIG. 3 is a layout diagram illustrating main and sense MOSFETs that are used in a current control semiconductor element according to a second embodiment of the invention.

FIG. 3 is a layout diagram illustrating main and sense MOSFETs that are used in the current control semiconductor element according to the second embodiment of the invention. In FIG. 2, reference symbols that are the same as those illustrated in FIG. 1 indicate the same parts.

In FIG. 3, a multi-finger MOSFET located at the center in a longitudinal direction (Y direction: channel width direction) is the same as the multi-finger MOSFET in the layout illustrated in FIG. 2. Two regions 8a and 8b that are surrounded by dotted lines are regions that are included in a main MOSFET 7b and in which the sense MOSFETs 8 are formed.

Multi-finger MOSFETs 7a and 7c sandwich the main MOSFET 7b and are arranged in the Y direction that is the channel width direction. The MOSFETs 7a, 7b and 7c form a multi-finger MOS array.

The upper and lower multi-finger MOSFETs 7a and 7c that sandwich the central multi-finger MOSFET do not include a region in which a sense MOSFET is formed. For wiring of the line 8DW drawn out from the drains of the sense MOSFETs, however, the multi-finger MOSFET 7a has dummy MOSFETs 7dmmy(a) and 7dmmy(b) arranged on the upper side of the regions 8a and 8b, and the multi-finger MOSFET 7c has dummy MOSFETs 7dmmy(b) and 7dmmy(b) arranged on the lower side of the regions 8a, 8b in which the sense MOSFETs 8 are formed. The gates of the dummy MOSFETs 7dmmy(a), 7dmmy(b), 7dmmy(c) and 7dmmy(d) are shorted on the sides of the sources of the dummy MOSFETs.

In this manner, the shapes of drain wirings of the regions 8a and 8b in which the sense MOSFETs 8 are formed match the shapes of drain wirings of other MOSFETs. Thus, a variation in the sense ratio, caused by a variation in a wiring resistance, can be suppressed.

In the multi-finger MOS array illustrated in FIG. 3, the number of main MOSFETs is 52 and the number of sense MOSFETs is 4. Thus, the sense ratio is 2/21 and reduced to 1/3 of the sense ratio in the layout illustrated in FIG. 2.

As described with reference to FIG. 2, if 400 main MOSFETs and 4 sense MOSFETs are arranged in the X direction in the actual layout of the multi-finger MOSFET 7b arranged at the center in the Y direction, the sense ratio is 1/30 in the multi-finger MOS array illustrated in FIG. 3.

As described above, the precision of the sense ratio can be improved in the layout according to the present embodiment even when a temperature distribution exists in the main MOSFETs.

In addition, the sense ratio can be reduced, compared with the example illustrated in FIG. 2.

Next, a configuration and operations of a current control semiconductor element according to a third embodiment of the invention are described with reference to FIG. 4. The overall configuration of the current control semiconductor element according to the present embodiment is the same as the configuration illustrated in FIG. 1.

Figure 4:
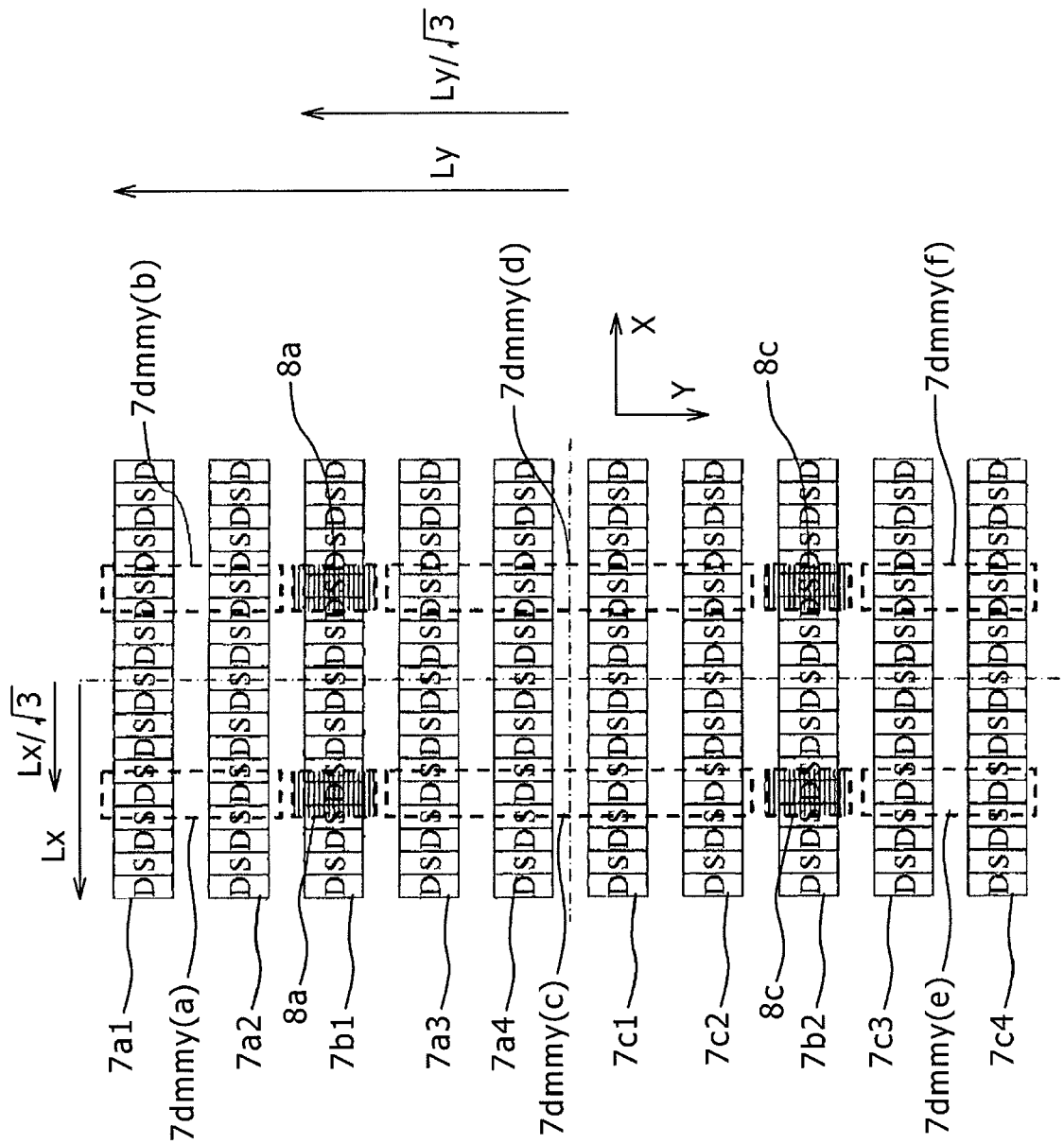
FIG. 4 is a layout diagram illustrating main and sense MOSFETs that are used in a current control semiconductor element according to a third embodiment of the invention.

FIG. 4 is a layout diagram illustrating main and sense MOSFETs that are used in the current control semiconductor element according to the third embodiment of the invention. In FIG. 4, reference symbols that are the same as those illustrated in FIG. 1 indicate the same parts.

In the example illustrated in FIG. 4, 10 multi-finger MOSFETs are arranged in the Y direction (channel width direction) and form a multi-finger MOS array. In FIG. 4, illustration of gates G is omitted, and only drains D and sources are illustrated. The gates G, however, are actually arranged between the drain D and the sources S as described with reference to FIG. 2.

Multi-finger MOSFETs 7b1 and 7b2 each include main MOSFETs and sense MOSFETs, while the sense MOSFETs are arranged in the main MOSFETs, like the multi-finger MOSFET 7b described with reference to FIG. 3. The sense MOSFETs 8a, 8b, 8c and 8d are arranged so that drains D that contact channels located closest to positions that are distant by the distance of $(L/\sqrt{3})$ from the center O of the multi-finger MOSFETs in the X direction (perpendicular to the channel width direction) are used for the sense MOSFETs.

In the same manner as the multi-finger MOSFETs 7a and 7c described with reference to FIG. 3, multi-finger MOSFETs 7a1 and 7a2 each include main MOSFETs and dummy MOSFETs 7dmmy(a) and 7dmmy(b); multi-finger MOSFETs 7a3, 7a4, 7c1 and 7c2 each include main MOSFETs and dummy MOSFETs 7dmmy(c) and 7dmmy(d); and multi-finger MOSFETs 7c3 and 7c4 each include main MOSFETs and dummy MOSFETs 7dmmy(e) and 7dmmy(f). The dummy MOSFETs 7dmmy(a), 7dmmy(b), 7dmmy(c), 7dmmy(d), 7dmmy(e) and 7dmmy(f) are arranged in the main MOSFETs. The positions of the dummy MOSFETs 7dmmy in the X direction (perpendicular to the channel width direction) are the same as the positions of the sense MOSFETs 8a, 8b, 8c and 8d.

The present embodiment has a feature of the positions of the multi-finger MOSFETs 7b1 and 7b2 including the sense MOSFETs 8a and 8b in the Y direction (channel width direction). It is assumed that a distance between the center O of the multi-finger MOSFETs and a channel that is farthest from the center O of the multi-finger MOSFETs in the Y direction is indicated by L. The sense MOSFETs 8a, 8b, 8c and 8d are arranged in the multi-finger MOSFETs 7b1 and 7b2 from the outside and contact channels located closest to positions distant by the distance of $(L/\sqrt{3})$ from the center O of the multi-finger MOSFETs in the Y direction.

As a result, the precision of the sense ratio of the sense MOSFETs 8a, 8b, 8c and 8d can be improved even when a temperature distribution in the X direction exists, as described with reference to FIG. 2. Current values of the channels located closest to the positions distant by the distance of $(L/\sqrt{3})$ from the center of the multi-finger MOSFETs in the Y direction are closest to the average of current values of channels within the multi-finger MOSFETs. Thus, by using the channels as the sense MOSFETs, the precision of the sense ratio can be improved even when a temperature distribution exists.

Even when the multi-finger MOS array is configured as described above, it is possible to eliminate dependence of the sense ratio on temperature distributions in the X and Y directions and thereby improve the precision of the sense ratio.

In the multi-finger MOS array illustrated in FIG. 4, since the number of main MOSFETs is 140 and the number of the sense MOSFETs is 4, the sense ratio becomes 1/35. That is, the sense ratio can be reduced compared with the sense ratio in the layout illustrated in FIG. 3.

As described with reference to FIG. 2, if 400 main MOSFETs and 4 sense MOSFETs are arranged in the X direction in the actual layout of the multi-finger MOSFET 7b arranged at the center in the Y direction, the sense ratio is 1/1000 in the multi-finger MOS array illustrated in FIG. 4.

As described above, even when a temperature distribution exists in the main MOSFETs in the array, the precision of the sense ratio can be improved by the layout according to the present embodiment.

In addition, the sense ratio can be reduced, compared with the example illustrated in FIG. 2.

Next, a configuration and operations of an automatic, transmission control device using current control semiconductor elements according to any of the embodiments of the invention are described with reference to FIG. 5.

Figure 5:
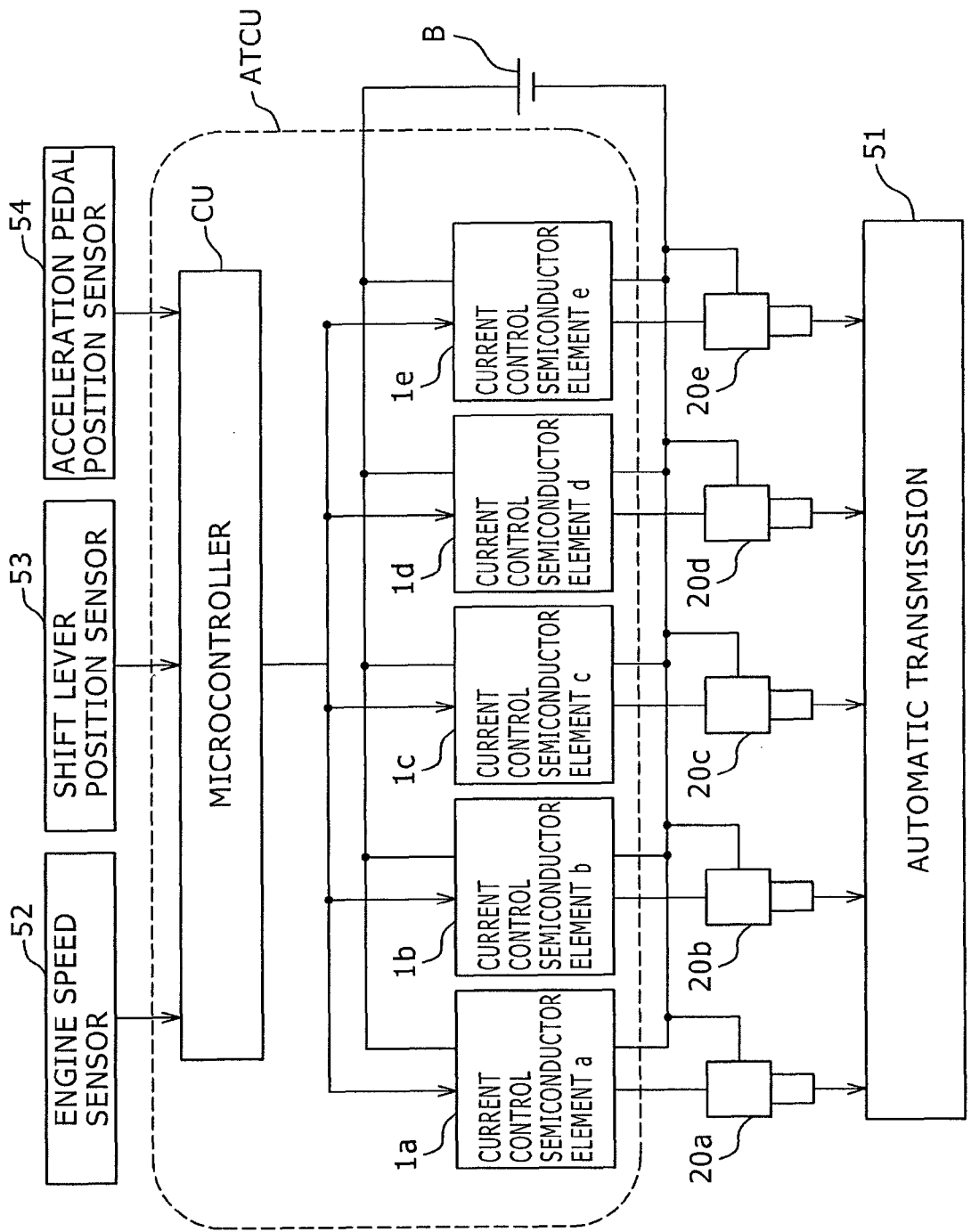
FIG. 5 is a block diagram illustrating a configuration of an automatic transmission control device using current control semiconductor elements according to any of the embodiments of the invention.

FIG. 5 is a block diagram illustrating the configuration of the automatic transmission control device using current control semiconductor elements according to any of the embodiments of the invention. In FIG. 5, reference symbols that are the same as those illustrated in FIG. 1 indicate the same parts.

The automatic transmission control device ATCU includes a microcontroller CU and a plurality of current control semiconductor elements 1a, ..., 1e. The microcontroller CU is the upstream-side control device illustrated in FIG. 1. The plurality of current control semiconductor elements 1a, ..., 1e each correspond to the current control semiconductor element 1.

The microcontroller CU receives sensor values from an engine speed sensor 52, a shift lever position sensor 53 and an acceleration pedal position sensor 54 and calculates an optimal transmission gear ratio from the received sensor values. To achieve the optimal transmission gear ratio, the microcontroller 1 calculates command values for hydraulic pressure of a plurality of clutches (not illustrated) included in a transmission 51 and command values for current values of solenoids 20a, ..., 20e, while the current values correspond to the hydraulic pressure. Then, the microcontroller 1 outputs the command values Ia*, ... Ie* for the current values to the current control semiconductor elements 1a, ..., 1e.

As described above in the embodiments, currents can be detected and controlled by the current control semiconductor elements 1a, ..., 1e with high accuracy. Thus, a speed of a vehicle can be smoothly changed and a ride quality of the vehicle can be improved.

In FIG. 5, the microcontroller CU receives the sensor values from the engine speed sensor 52, the shift lever position sensor 53 and the acceleration pedal position sensor 54. The number and types of sensors from which the microcontroller CU receives sensor values, however, may be changed on the basis of a transmission control method. In FIG. 5, the microcontroller CU directly receives the sensor values from the sensors. The microcontroller CU, however, may receive the sensor values through another microcontroller or an IC. Although, FIG. 5 illustrates an example in which the automatic transmission 51 has the five clutches, the number of clutches may be changed on the basis of a transmission mechanism, and the number of solenoid current control devices that correspond to the clutches may be changed.

Next, a configuration and operations of a brake control device using a current control semiconductor element according to any of the embodiments of the invention are described with reference to FIG. 6.

Figure 6:
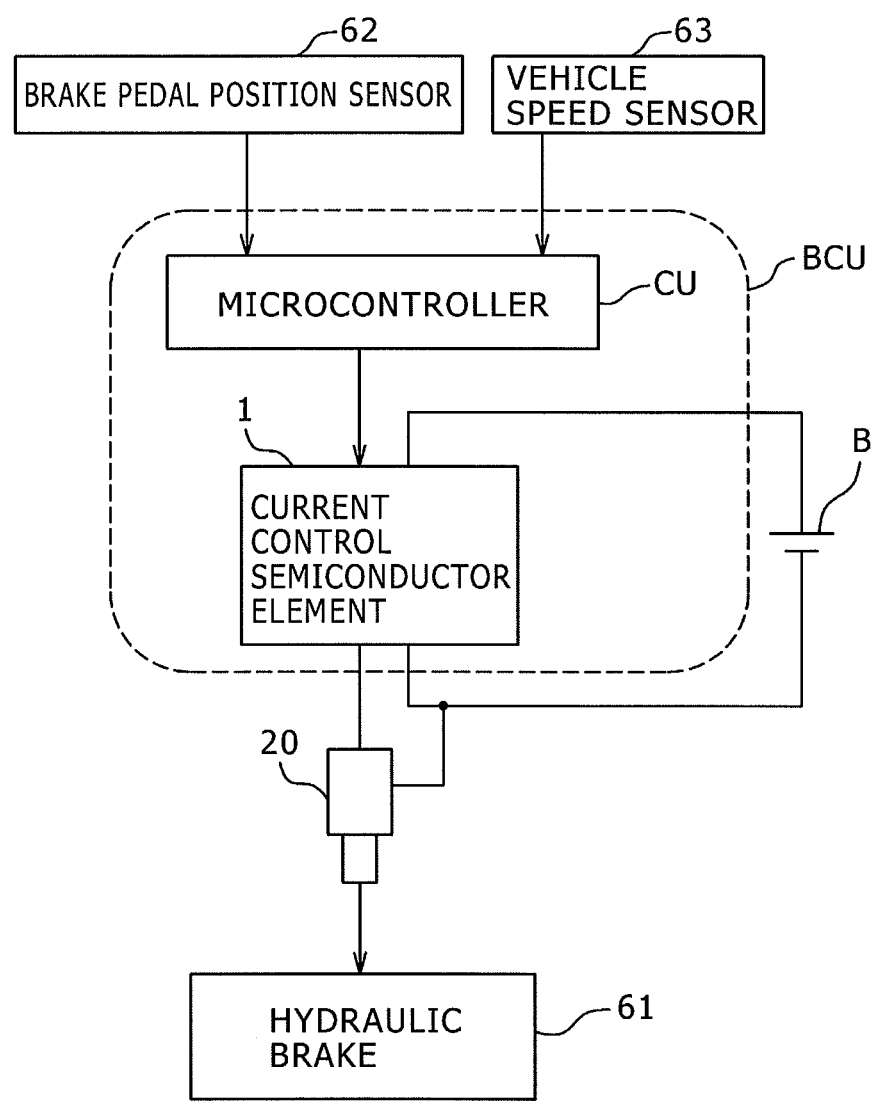
FIG. 6 is a block diagram illustrating a configuration of a brake control device using a current control semiconductor element according to any of the embodiments of the invention.

FIG. 6 is a block diagram illustrating the configuration of the brake control device using a current control semiconductor element according to any of the embodiments of the invention. In FIG. 6, reference numerals and symbols that are the same as those illustrated in FIG. 1 indicate the same parts.

The brake control device BCU includes the microcontroller CU illustrated in FIG. 1 and the current control semiconductor element 1.

The microcontroller CU receives sensor values from a brake pedal position sensor 63 and a vehicle speed sensor 64 and calculates the optimal brake force from the received sensor values. To achieve the braking force, the microcontroller CU calculates a command value for hydraulic pressure of a hydraulic brake 61 and a command value for a current value of a solenoid 20, while the current value of the solenoid 20 corresponds to the hydraulic pressure. Then, the microcontroller CU outputs the command value I* for the current value to the current control semiconductor element 1.

As described above in the embodiments, the current control semiconductor element 1 can detect and control a current with high accuracy. Thus, smooth braking can be achieved and a ride quality of a vehicle can be improved.

In FIG. 6, the microcontroller CU receives the sensor values from the brake pedal position sensor 63 and the vehicle speed sensor 64. The number and types of sensors from which the microcontroller CU receives sensor values, however, may be changed on the basis of a braking method. In FIG. 6, the microcontroller CU directly receives the sensor values from the sensors. The microcontroller CU, however, may receive the sensor values through another microcontroller or an IC.

Next, a configuration and operations of a brushless motor control device using current control semiconductor elements according to any of the embodiments of the invention are described with reference to FIG. 7.

Figure 7:
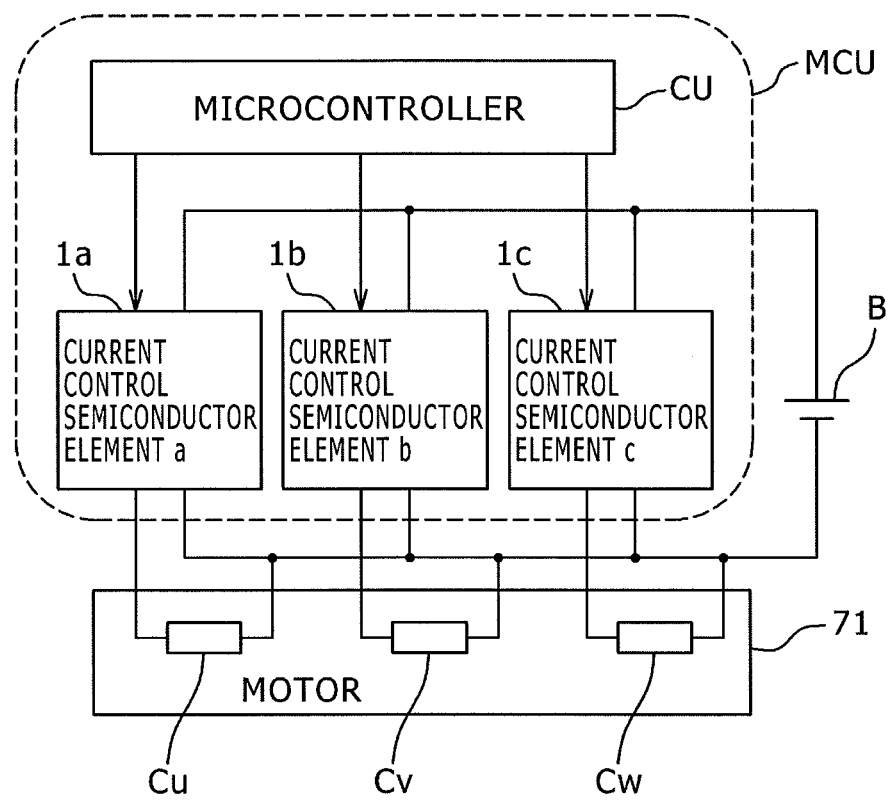
FIG. 7 is a block diagram illustrating a configuration of a brushless motor control device using current control semiconductor elements according to any of the embodiments of the invention.

FIG. 7 is a block diagram illustrating the configuration of the brushless motor control device using current control semiconductor elements according to any of the embodiments of the invention. In FIG. 6, reference symbols that are the same as those illustrated in FIG. 1 indicate the same parts.

The brushless motor control device MCU includes the microcontroller CU illustrated in FIG. 1 and the current control semiconductor elements 1.

The microcontroller CU calculates a target rotational speed of a motor and three-phase current command values for three phase coils Cu, Cv and Cw of the motor 71. The three-phase current command values are calculated in order to achieve torque. Then, the microcontroller CU outputs the three-phase current command values Iu*, Iv* and Iw* to the current control semiconductor elements 1a, ..., 1c.

As described above in the embodiments, the current control semiconductor elements 1a, ..., 1c can detect and control currents with high accuracy. Thus, the motor can be smoothly controlled.

DESCRIPTION OF REFERENCE CHARACTERS

1 ... Current control semiconductor element
4 ... Controller
5 ... PWM signal generator
6 ... Driver
7 ... Main MOSFET
8 ... Sense MOSFET
9 ... Low-side MOSFET
20 ... Solenoid
B ... Battery

The invention claimed is:

1. A current control semiconductor element comprising:
a main MOSFET that drives a current; and
a sense MOSFET that is connected to the main MOSFET in parallel and detects a current shunted from a current of the main MOSFET, the main MOSFET and the sense MOSFET being arranged on the same semiconductor chip,
wherein the main MOSFET is formed using a multi-finger MOSFET that has a plurality of channels and is arranged in a row,
wherein a part of the channels of the multi-finger MOSFET is used as a channel for the sense MOSFET, and
wherein when a distance between the center of the multi-finger MOSFET and a channel located farthest from the center of the multi-finger MOSFET is indicated by L, a channel that is located closest to a position distant by a distance of $(L/\sqrt{3})$ from the center of the multi-finger MOSFET is used as the channel for the sense MOSFET.

2. The current control semiconductor element according to claim 1,
wherein the MOSFETs that form the multi-finger MOSFET have the same pattern.

3. The current control semiconductor element according to claim 2,
wherein channels are arranged symmetrically with respect to the center of the multi-finger MOSFET in a direction in which the MOSFETs of the multi-finger MOSFET are arranged, and are closest to positions distant by the distance of $(L/(\sqrt{3}))$ from the center of the multi-finger MOSFET, the channels being used as channels for sense MOSFETs.

4. The current control semiconductor element according to claim 1,
wherein multi-finger MOSFETs having the same shape as the multi-finger MOSFET arranged in the row are arranged in a plurality of rows in a direction of the widths of the channels of the multi-finger MOSFET so that a multi-finger array is formed, and
wherein when a distance between the center of the multi-finger array and a multi-finger MOSFET located farthest from the center of the multi-finger array in the direction in which the multi-finger MOSFETs are arranged is indicated by Lx, and distances between the centers of the multi-finger MOSFETs and channels located farthest from the centers of the multi-finger MOSFETs in the direction of the widths of the channels of the multi-finger MOSFETs are indicated by Ly, channels that are included in selected multi-finger MOSFETs located closest to positions distant by a distance of $(Lx/(\sqrt{3}))$ from the center of the multi-finger array and are located closest to positions distant by a distance of $(Ly/(\sqrt{3}))$ from the centers of selected multi-finger MOSFETs are used as channels for sense MOSFETs.

5. The current control semiconductor element according to claim 4,
wherein when distances between the centers of the selected multi-finger MOSFETs and channels located farthest from the centers of the selected multi-finger MOSFETs in the direction of the widths of the channels of the multi-finger MOSFETs are indicated by Ly, channels that are located closest to the positions distant by the distance of $(Ly/(\sqrt{3}))$ from the centers of the selected multi-finger MOSFETs are used as the channels for the sense MOSFETs, and
wherein other MOSFETs selected as the multi-finger MOSFETs located closest to the positions distant by the distance of $(Lx/(\sqrt{3}))$ from the center of the multi-finger array are used as dummies.

6. A control device comprising:
a current control semiconductor element; and
a microcontroller that controls the current control semiconductor element,
wherein the current control semiconductor element includes
a main MOSFET that drives a current, and
a sense MOSFET that is connected to the main MOSFET in parallel and detects a current shunted from a current of the main MOSFET, the main MOSFET and the sense MOSFET being arranged on the same semiconductor chip,
wherein the main MOSFET is formed using a multi-finger MOSFET that has a plurality of channels and is arranged in a row,
wherein a part of the channels of the multi-finger MOSFET is used as a channel for the sense MOSFET, and
wherein when a distance between the center of the multi-finger MOSFET and a channel located farthest from the center of the multi-finger MOSFET is indicated by L, a channel that is located closest to a position distant by a distance of $(L/(\sqrt{3}))$ from the center of the multi-finger MOSFET is used as the channel for the sense MOSFET.

* * * * *